United States Patent
Van Brocklin et al.

(10) Patent No.: US 6,870,751 B2
(45) Date of Patent: Mar. 22, 2005

(54) LOW-ENERGY WRITING IN CROSS-POINT ARRAY MEMORY DEVICES

(75) Inventors: Andrew L. Van Brocklin, Corvallis, OR (US); Peter Fricke, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 254 days.

(21) Appl. No.: 10/289,589

(22) Filed: Nov. 7, 2002

(65) Prior Publication Data

US 2004/0090823 A1 May 13, 2004

(51) Int. Cl.[7] .............................................. G11C 17/00
(52) U.S. Cl. ...................................... 365/96; 365/225.7
(58) Field of Search ............................ 365/96, 225.7; 257/209, 530

(56) References Cited

U.S. PATENT DOCUMENTS

| | | | | | |
|---|---|---|---|---|---|
| 5,282,158 A | * | 1/1994 | Lee | ............................. | 365/96 |
| 6,061,264 A | * | 5/2000 | Giust et al. | .................. | 365/96 |
| 6,229,733 B1 | * | 5/2001 | Male | .................... | 365/185.18 |
| 6,512,284 B2 | * | 1/2003 | Schulte et al. | ............. | 257/530 |

* cited by examiner

*Primary Examiner*—Anh Phung

(57) ABSTRACT

Disclosed are improved cross-point array memory devices. In one embodiment, a memory device comprises a cross-point array of memory cells, each memory cell including a storage element and a current concentrating feature that concentrates current applied to the storage element. In another embodiment, a memory device comprises a cross-point array of memory cells, each memory cell including a storage element having a preprogrammed filament fuse configured to be disabled during a write procedure.

37 Claims, 6 Drawing Sheets

LOW-ENERGY WRITING IN CROSS-POINT ARRAY MEMORY DEVICES

FIELD OF THE INVENTION

The present disclosure relates to solid-state memory devices. More particularly, the present disclosure relates to low-energy writing in cross-point array memory devices.

BACKGROUND OF THE INVENTION

Solid-state memory devices have increased in popularity in recent years. By way of example, flash memory has come into common use in many devices such as digital cameras, music players, and the like. In several solid-state memory devices, cross-point arrays of memory cells are provided that, for instance, are capable of two or more different resistance states that indicate a logic value stored by the memory cell. For instance, each memory cell can be capable of a first (e.g., high) resistance state that represents a logic value "1" and a second (e.g., low) resistance state that represents a logic value "0."

To write data to a selected memory cell in such an array, current flow is provided to the selected memory cell to change its resistance state. This state can be read by applying another, typically lesser, potential to the memory cell to sense its resistivity.

Although the amount of voltage, and therefore energy, required to write to memory cells of cross-point memory arrays is not large in an absolute sense, a relatively large amount of energy is expended in the aggregate over the course of many writes and reads.

SUMMARY OF THE INVENTION

Disclosed are improved cross-point array memory devices. In one embodiment, a memory device comprises a cross-point array of memory cells, each memory cell comprising a storage element and a current concentrating feature that concentrates current applied to the storage element.

In another embodiment, a memory device comprises a cross-point array of memory cells, each memory cell comprising a storage element having a preprogrammed filament fuse configured to be disabled during a write procedure.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

It would be desirable to have a means with which less energy can be expended in writing to a memory cell of a cross-point array memory device. Disclosed herein are various mechanisms and methods through which reduced energy writing can be facilitated. Although particular embodiments are disclosed, these embodiments are provided by way of example only and are not intended to limit the scope of this disclosure.

Figure 1:
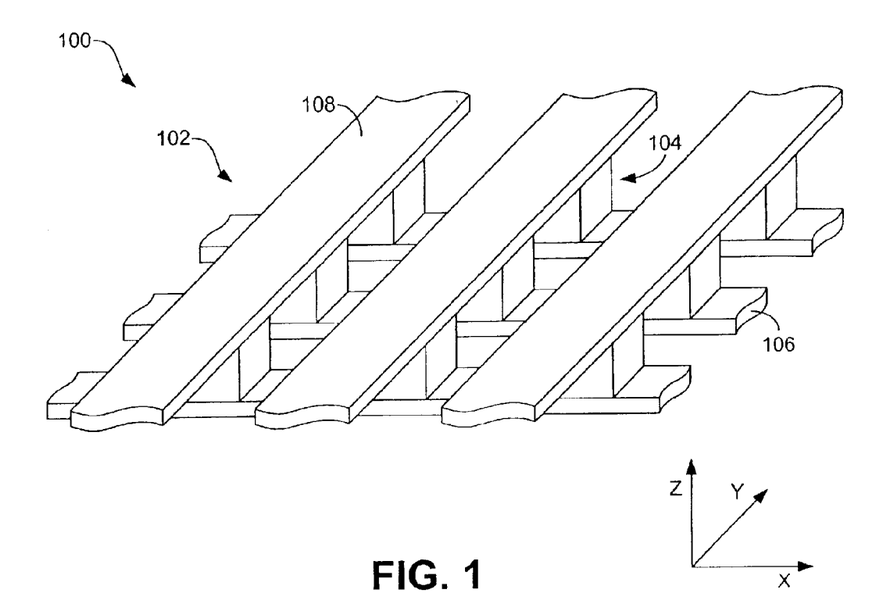
FIG. 1 is a schematic perspective view of a cross-point array of memory cells in a cross-point array memory device.

Referring now in more detail to the drawings, in which like numerals indicate corresponding parts throughout the several views, FIG. 1 illustrates a cross-point array memory device 100 that comprises a cross-point array 102 of memory cells 104. Only a relatively small number of memory cells 104 is shown to simplify the explanation of the memory device 100. In practice, arrays of any size may be used. In addition, although an orthogonal array of memory cells 104 is depicted, persons having ordinary skill in the art will appreciate that alternative (e.g., oblique) arrays are feasible. Multiple layers of such arrays can also be vertically stacked to create larger memory capacity in a cost-effective manner.

Electrically connected to each memory cell 104 is a row conductor or line 106 and a column conductor or line 108 that are, in the embodiment of FIG. 1, arranged along the x and y axes, respectively, of the memory device 100. This arrangement results in a memory cell 104 being located at each cross-point of a corresponding row and column conductor 106, 108.

As is described in greater detail below, each memory cell 104 comprises a resistive element, or storage element, whose resistance can be modified (at least once) to indicate, and therefore store, a given logic value. These logic values can be written and read using a read/write circuit (not shown) that is configured to applying read and write potentials to selected memory cells 104. In particular, the read/write circuit can be used to apply appropriate write potentials to the row and column and row conductors 106, 108 associated with the selected memory cell 104 to change the resistance state of the cell during a write, and can apply appropriate read potentials to the row and column conductors to determine the resistance state of the cell during a read.

The nature of the resistive (storage) elements depends upon the particular embodiment and the mode of operation desired. In one embodiment, the resistive elements can comprise anti-fuse elements that, when exposed to a critical electrical field, become overstressed and/or damaged so as to result in a dielectric breakdown that permanently changes the anti-fuse element to a low resistance state. In such a reading/writing scheme, a first logic value (e.g., "1") is indicated when the anti-fuse element is in the unaltered (high resistance) state and a second logic value (e.g., "0") is indicated when the element is in the breakdown (low resistance) state, or vice versa if desired. By way of example, the resistance of the anti-fuse element in the unaltered state may be on the order of 1 Megaohm to 1 Gigaohm or greater, while the resistance of the element in the breakdown state may be on the order of 100 ohms to 10,000 ohms.

These resistance states can be detected, for instance, using at least one sense amplifier of the read/write circuit. Generally speaking, the maximum read voltage is less than the minimum write voltage such that there is no overlap between the read and write voltages. In that the read potentials are typically much smaller in magnitude than the write potentials, detection of the resistance state does not result in dielectric breakdown of selected memory cells. Because the state of the anti-fuse elements is not reversible, i.e. the memory element cannot be re-written to after the low resistance state is achieved, a write-once memory device results where such anti-fuse elements are used.

By way of example, the anti-fuse elements can comprise layers of an oxidized metal, thermally-grown oxide, or deposited oxides or nitrides. For example, the anti-fuse elements can be formed as oxide layers of aluminum, copper, or silicide and alloys thereof, although persons having ordinary skill in the art will appreciate that other conductive metals or semiconductors can be used. When formed as an oxide layer, the anti-fuse element typically is broken down (i.e., fused) by electron tunneling or dielectric rupture dynamics. Typically, the electron tunneling is direct thereby requiring that the oxide layer thickness be minimal, such as about 5 to about 50 angstroms. Notably, thicknesses greater or lesser than this range are feasible.

When low voltage potentials are applied across an oxide layer, such as during reading of the memory cell 104, the current may be in the low microampere or nanoampere range (potentially as low as 50 nanoamperes). When the oxide layer is programmed (written) by creating filaments through the oxide, the current is in the microampere or low milliamp range. This range in current levels provides a good signal-to-noise ratio for sensing whether the oxide is programmed as a logical "1" or "0" state. At higher voltage potentials, such as during programming, the oxide layer begins to have higher current flows due to the tunneling current. This tunneling current creates a flow of electrons that locally heats the anti-fuse element (oxide) and forms the conductive filaments through the oxide. When sufficient energy is forced across the oxide layer (i.e., barrier) to sufficiently heat the fusing site, a conducting filament is formed through the oxide and the state of the oxide is permanently changed for a one-time programmable structure.

In another embodiment, the resistive (storage) elements comprise layers of phase-change material that can be reversibly switched back and forth between two or more distinct resistance states to identify different logic values. In such a case, the resistive elements may, for instance, be formed of a material whose composition can be changed from an amorphous (high resistance) state to a crystalline (low resistance) state through the application of appropriate potentials.

To change from the amorphous to the crystalline state, the voltage applied to the selected memory cell is increased and then slowly decreased. This increase/decrease heats the amorphous material and then permits it to slowly cool so that the affected area has time to anneal into the crystalline state. To then reverse the process and change from the crystalline to amorphous state, relatively high voltage is applied to the memory cell 104 and then this voltage is rapidly reduced, thereby returning the phase-change material to the amorphous state. In view of this reversibility, memory devices 100 that include such phase-change layers of material are considered re-writable.

One possible phase-change material for such applications is germanium telluride (GeTe), which can be controllably changed from a semiconducting (amorphous) to a metallic (crystalline) through appropriate heating and cooling. For example, if GeTe is doped so that it is p-type when in its semiconducting state and is deposited on top of an n-type semiconductor-layer, a large contrast can be observed in the number of carriers swept across the junction if the GeTe is changed to its metallic state. Other phase-change materials can be substituted for GeTe including, for example, chalcogenide alloys such as GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$, and GeSbTe.

Alternative state-change technologies can be used for the resistive elements. For example, the resistive element can comprise a read-only LeComber (i.e., antifuse) or silicide switch. In the former case, a LeComber switch can be created by depositing a thin layer of amorphous intrinsic silicon on a layer of metal (e.g., chromium (Cr)) and then depositing a separate metal, such as gold (Ag), on the silicon. Before programming, the LeComber switch acts as a reversed-biased tunnel diode. Creating an enhanced concentrated electric field through the amorphous silicon causes conductive paths to form or allow for hopping conduction, thus creating an anti-fuse.

Silicide switches may be formed with alternatively stacked silicon and transition metal thin films that change resistance when programmed. Generally speaking, the programming process for a silicide anti-fuse is irreversible. Before writing, the stack of transaction metal and silicon layers has a first resistance. When appropriate row and column conductors are selected to force a current through a selected memory cell, the current passing through the cell creates Joule heat that triggers and completes a silicidation reaction. By using the concentrated electric field, current is focused and thus the Joule heat is concentrated in a smaller area thereby allowing the programming to be completed in a relatively short period of time. The silicidation reaction causes the resistance of the selected memory cell to change to a much lower magnitude. To read the programmed memory cell, a relatively small sense current is supplied to the selected memory cell and the voltage drop across the selected memory cell is sensed. Examples of potentially suitable silicide compounds include $Ni_2Si$, NiSi, $NiSi_2$, $Pd_2Si$, PdSi, and $Pt_2Si$, and PtSi. Other possible transition metals in various compounds with silicon include Ti, V, Cr, Mn, Fe, Co, Zr, Nb, Mo, Rh, Hf, Ta, W, and Ir.

Figure 2:
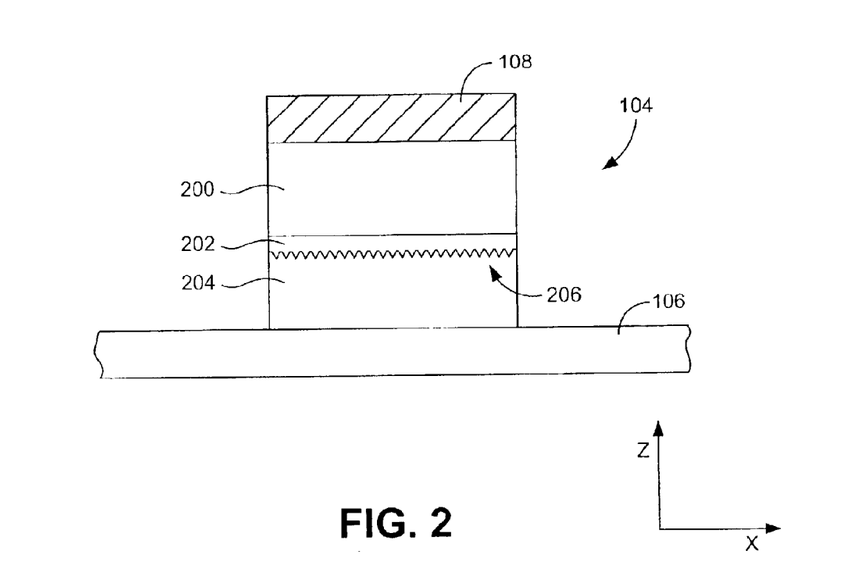
FIG. 2 is a side view of a first embodiment of the memory cells shown in FIG. 1.

FIG. 2 is a schematic side view of a first embodiment of a memory cell 104 that may be used in the construction of the cross-point array memory device 100 of FIG. 1. As indicated in FIG. 2, the memory cell 104, shown connected to the row and column conductors 106, 108, comprises a control element 200, an intermediate conductor 202, and a storage element 204. Each of these components can, for instance, be provided as a layer in a serially-connected stacked arrangement.

The control element 200 is provided to control and deliver current to the storage element 204 when the resistance state of the storage element is to be changed during a write procedure. By way of example, the control element 200 comprises a tunnel junction device or a diode such as a PN, PIN, or Schottky diode. Other possible diode arrangements can be used such as Zener diodes, avalanche diodes, tunnel diodes, and a four-layer diode such as a silicon-controlled rectifier. When formed as a diode, the control element 200 can be fabricated using doped polysilicon, amorphous silicon, or microcrystalline silicon. Although tunnel junction device and diode arrangements have been identified, persons having ordinary skill in the art will appreciate that other arrangements are possible. For example, in an alternative arrangement, the control element 200 can comprise a junction field effect or bipolar transistor.

As described above, the storage element 204 is designed to change resistance states when an appropriate potential is applied to the element so that different logic values may be stored. Where the storage element 204 is configured as an anti-fuse element, the storage element is configured to predictably and reliably breakdown at a lower energy level than the control element 200. Likewise, where the storage element 204 is configured as a phase-change element, the storage element is configured to predictably and reliably change from amorphous to crystalline states, or vice versa, when an appropriate potential is applied for the correct duration.

Although the control element 200 and the storage element 204 are shown as having substantially equal cross-sectional areas (see FIGS. 1 and 2), the control element cross-sectional area can, optionally, be substantially larger than the storage element cross-sectional area (e.g., a ratio in the range of 2:1 to 20:1) so that storage element 204 changes state at a much lower energy level than the control element 200 such that the memory cell 104 may be read by providing a relatively low amount of energy to the cell 104. Such an arrangement is disclosed in U.S. patent application Ser. No. 10/116,497, filed Apr. 2, 2002, which is hereby incorporated by reference into the present disclosure.

The control element 260 is electrically connected to the storage element 204 with the intermediate conductor 202. In particular, the control element 200 and the storage element 204 are serially connected via the intermediate conductor 202. In use, the intermediate conductor 202 conducts current provided from the control element 200 to the storage element 204 to either write to the storage element (by causing break down or phase-change) or read the storage element.

The nature of the storage element 204 depends upon the application and the desired results. Accordingly, the storage element 204 may comprise an anti-fuse element, phase-change element, or other state-change element described above. As will be apparent from the discussions that follow, reduced energy writing can be obtained irrespective of the particular nature of the storage element 204 using the disclosed techniques.

As noted above, it is desired to reduce the amount of energy that is required to write to the memory cells 104 and, therefore, to either breakdown, change the phase of, or otherwise change the state of the storage element 204. In one solution, this reduction in energy can be achieved by concentrating the current provided to the storage element 204 such that state-change occurs more quickly using less energy. Examples of configurations which provide this result are depicted in FIGS. 2–6 and are discussed in the following.

In the embodiment of FIG. 2, the intermediate conductor 202 is provided with a current concentrating feature in the form of protrusions 206 that extend into the storage element 204. These protrusions 206 can be formed using a variety of different techniques. For instance, the protrusions 206 can be formed by removing material from the intermediate conductor 202 using lithographic processes. In an alternative arrangement, the protrusions 206 are formed using a surface treatment technique such as a deep reactive ion etching (DRIE) procedure. Such a DRIE procedure can be used to form so-called "grassy silicon" in which various intentional surface "defects" are formed that protrude from the treated surface (i.e., intermediate conductor surface).

In yet another alternative, a nano-pattern of three-dimensional shapes (e.g., hexagonal plates) can be chemically formed on the conductor surface. For instance, alumina plates can be deposited on the conductor surface using an aluminum glycol reaction, and the plates then coated with a highly conductive material such as gold or platinum so as to form nano-sized current concentrators. In a further alternative, the protrusions 206 can be formed by applying nanotubes or slivers of material (e.g., metal) to the conductor surface with a chemical solution that is evaporated during a heating step. Persons having ordinary skill will appreciate that other alternative methods could be used to form the protrusions. Each of these other methods is considered to fall within the scope of the present disclosure.

Figure 3:
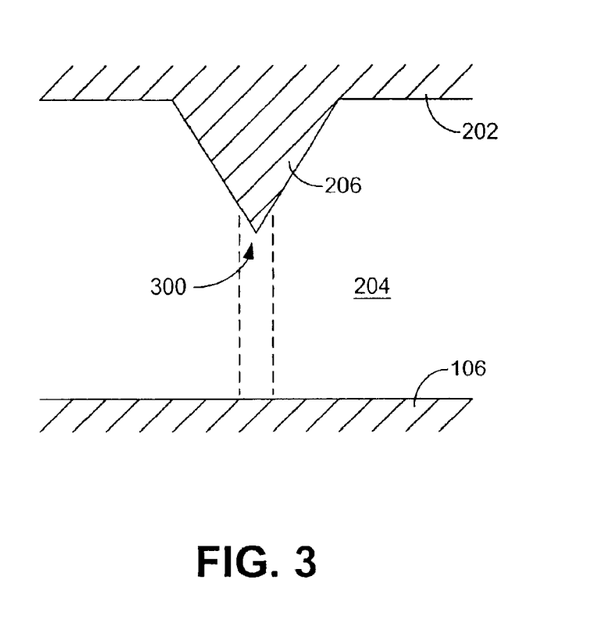
FIG. 3 is a schematic diagram illustrating the concentration of current in an embodiment of a conductor protrusion of the memory cell of FIG. 2.

Irrespective of the manner in which the protrusions 206 are formed, the protrusions serve as current concentrators that concentrate the current provided from the control element 200 and to the storage element 204 to reduce the amount of energy, and potentially time, required to cause a desired state-change. This phenomenon is illustrated in FIG. 3. As indicated in this figure, each protrusion 206 can comprise a sharp tip 300 that is substantially smaller than the entirety of the surface of the intermediate conductor 202. Accordingly, the tip 300 of the protrusion 206 comprises a very small volume that will concentrate the current that flows through the conductor 202. Due to the small size of the protrusion tip 300, current can likewise be concentrated on a smaller volume of the storage element material (indicated with dashed lines) so that state-change can be more easily achieved. Although a pointed "tip" is identified, substantially any shape in which a relatively small volume is created may be used. Notably, reduced energy may further result in reduced time to program. For example, if the concentration of current corresponds to a substantial increase in temperature, a phase-change storage element may more quickly change phase.

Figure 4:
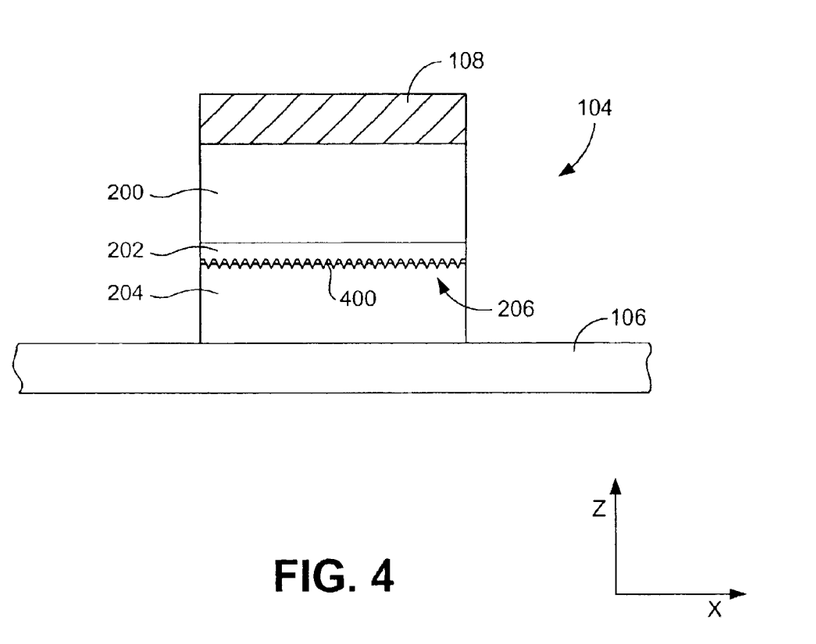
FIG. 4 is a side view of a second embodiment of the memory cells shown in FIG. 1.

FIG. 4 illustrates a second embodiment of the memory cell 104. This embodiment is similar to that shown in FIG. 2. Accordingly, the memory cell 104 comprises a control element 200, an intermediate conductor 202 having a plurality of protrusions 206, and a storage element 204. In addition, however, the memory cell 104 of FIG. 4 further comprises a layer of insulative material 400, such as oxides, nitrides, dielectrics, or intrinsic silicon, that is deposited or otherwise formed on the outer surface of the intermediate conductor 202 so as to reduce the area of the protrusions 206 that contact the storage element 204 to thereby further concentrate current delivered to the storage element.

Figure 5:
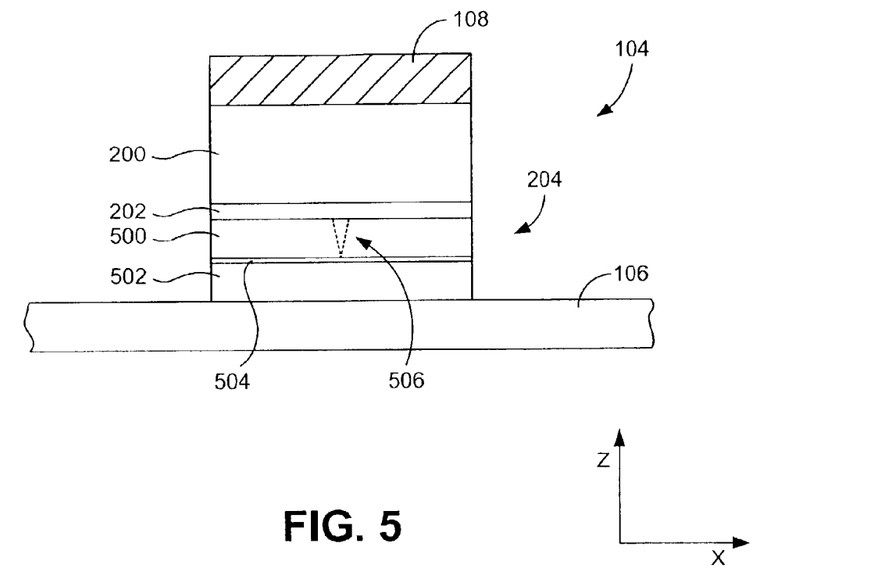
FIG. 5 is a side view of a third embodiment of the memory cells shown in FIG. 1.

FIG. 5 illustrates a third embodiment of the memory cell 104 that is a variation on the theme of the embodiments described above in relation to FIGS. 2–4. As indicated in FIG. 5, the memory cell 104 also comprises a control element 200, an intermediate conductor 202, and a storage element 204. However, in the embodiment of FIG. 5, the intermediate conductor 202 is not provided with any protrusions and the storage element 204 includes first and second layers 500 and 502 of material that are separated by a barrier layer 504. In such an arrangement, the second layer 502 may comprise a state-changing material and the barrier layer 504 may comprise a metal layer, semiconducting layer, or doped silicon, to name a few. By way of example, the first layer 500 can be composed of a conductive material and/or a state-change material similar to that used to construct the second layer 502.

After the memory cell 104 is fabricated, it can be pre-programmed during manufacturing by creating a current concentrating feature in the form of a conductive path 506 that extends from the intermediate electrode 202 to the barrier layer 504 so as to extend partway (e.g., halfway)

through the storage element 204. The potential applied to the memory cell 104 during this preprogramming is selected such that propagation of this conductive path 506 is halted by the barrier layer 504. After preprogramming, the storage element 204 is, in effect, half-programmed and current may be concentrated at the tip of the conductive path 506 in similar manner as with the protrusions 206 of the embodiments shown in FIGS. 2–4. With such preprogramming, the storage element 204 can be programmed (i.e., written to) by the user by using a greater amount of energy than that used to preprogram the first layer 500 so as to tunnel through the barrier layer 504. However, due to the partial programming of the storage element 204 and the current concentration provided with the conductive path 506, this amount of energy is less than would be required in a conventional arrangement.

Figure 6:
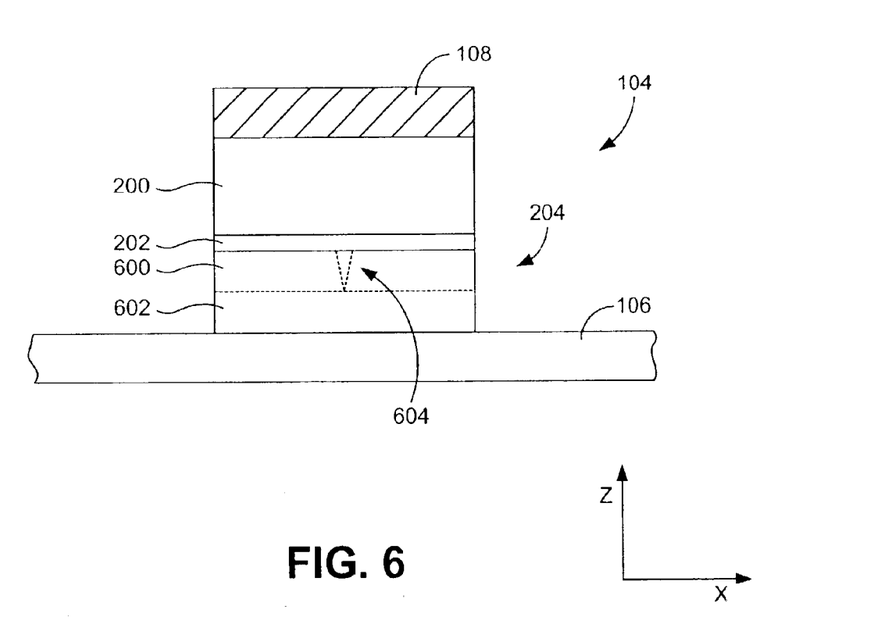
FIG. 6 is a side view of a fourth embodiment of the memory cells shown in FIG. 1.

FIG. 6 illustrates a fourth embodiment of the memory cell 104, which is a variation of that shown in FIG. 5. In the embodiment of FIG. 6, the storage layer 204 comprises first and second layers 600 and 602 of state-change material that require different amounts of energy to change state. In particular, the first layer 600, which is in contact with the intermediate conductor 202, is formed of a material that changes state when relatively little energy (low potential) is applied, and the second layer 602 is formed of a material that changes state only when a more nominal amount of energy is provided. By way of example, the first layer 600 can comprise aluminum-doped silicon and the second layer 602 can comprise pure silicon. In another example, the first layer 600 can comprise copper-doped aluminum and the second layer 602 can comprise pure aluminum.

With the arrangement shown in FIG. 6, the memory cell 104 can be preprogrammed during manufacturing by creating a current concentrating conductive path 604 through the first layer 600 using a low amount of energy in similar manner to that described above in relation to the embodiment of FIG. 5. The storage element 204 can then be fully programmed (i.e., written to) by the user by using a nominal amount of energy.

Figure 7:
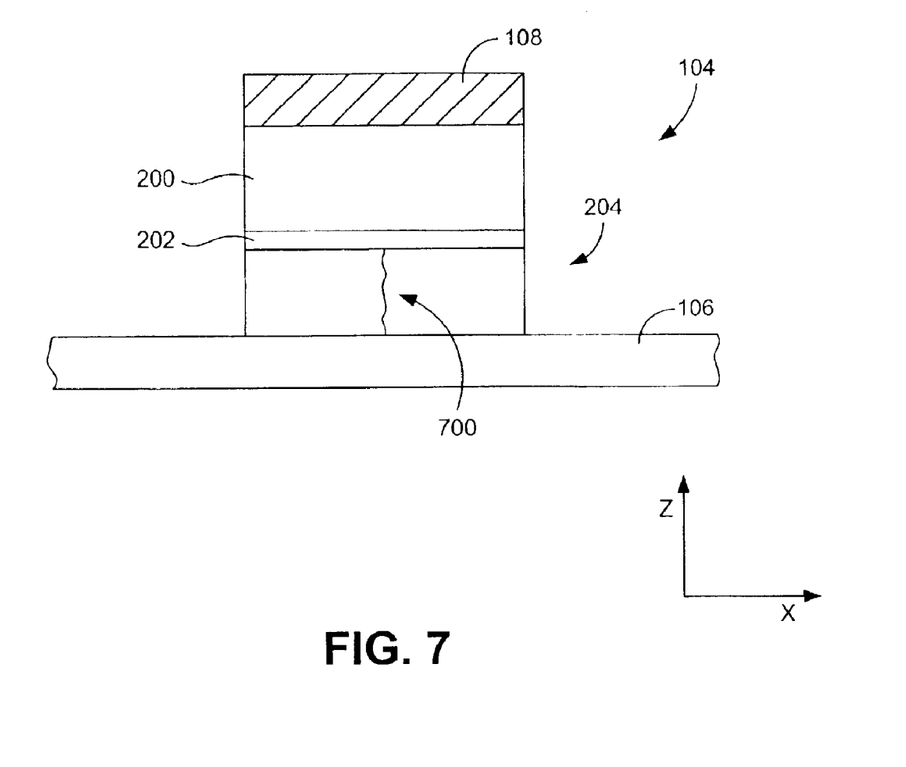
FIG. 7 is a side view of a fifth embodiment of the memory cells shown in FIG. 1.

In addition to concentrating current using protrusions or preprogrammed conductive paths, the energy required to write to a memory cell 104 can be reduced by providing a storage element 204 with a preprogrammed fuse that the user can disable in a write-once scheme. An example of such a scheme is illustrated in FIG. 7, which depicts a fifth embodiment of the memory cell 104. As shown in this figure, the memory cell 104 again includes a control element 200, intermediate conductor 202, and a storage element 204. The storage element 204 preferably is composed of an anti-fuse material such as one of the materials identified above. Created during manufacturing is a fuse 700 that, for instance, comprises a filament formed by applying a nominal potential to the memory cell 104. In that the fuse 702 is extremely small in cross-section, for instance only a few (e.g., less than ten) atoms wide, it can be disabled (i.e., blown) by applying a relatively small potential to the memory cell 104, thereby reducing the amount of energy required to write to the memory cell.

The memory device 100 described above, and incorporating one of the above-described embodiments of memory cells 104, can be embedded within conventional integrated circuits (ICs) such as microprocessors, graphic processors, storage processors, and the like. For instance, a traditional central processing unit (CPU) uses large arrays of memory for internal level 1 and level 2 cache memory. These cache memories typically consume a large area within a traditional processor layout. By using a memory array that is disposed on top of the processor core computer circuits, a smaller die size can be achieved.

Figure 8:
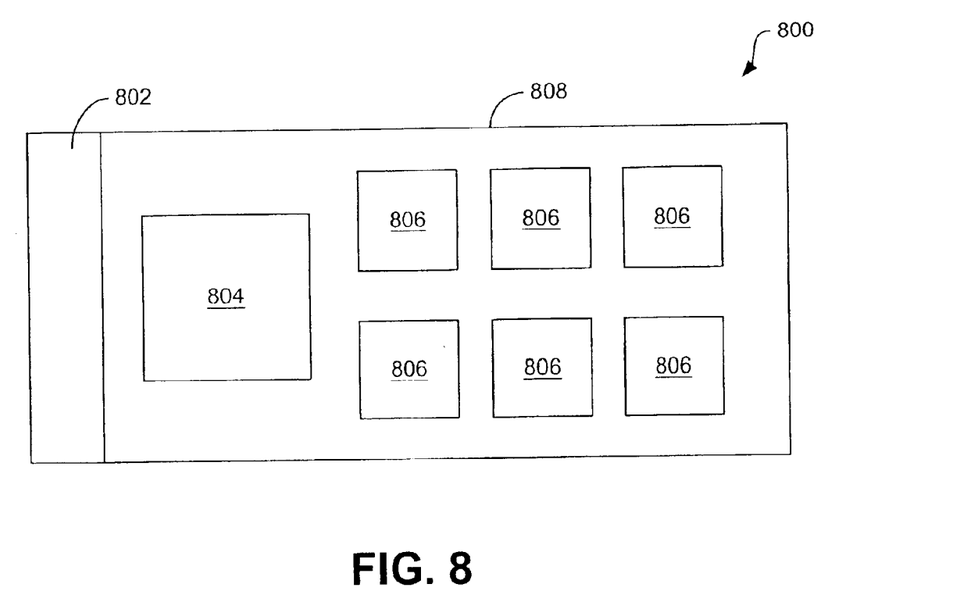
FIG. 8 is a schematic plan view of a memory carrier that incorporates the memory device of FIG. 1.

FIG. 8 is a schematic view of an example memory carrier 800 that incorporates at least one embodiment of the disclosed memory cells 104. The memory carrier 800 represents any of several conventional standard or proprietary memory card formats, such as personal computer memory card international association (PCMCIA), personal computer (PC) card, Smart memory, memory stick, digital film, advanced technology attachment (ATA), and compact flash. The memory carrier 800 includes a mechanical interface 802 that provides for both mechanical and electrical contact with a particular connector for the type of memory carrier standard implemented. An optional electrical interface 804 provides for electrical coupling with the electrical contacts on the mechanical connector 802 and provides the proper security, address decoding, voltage translation, write protection, or other typical interface functions with a set of memory ICs 806, which incorporate at least one cross-point memory array in accord with the present disclosure. A carrier 808, for example a printed circuit board (PCB) or ceramic substrate, typically is used to physically support the memory ICs 806, electrical interface 804, and mechanical interface 802. It will be appreciated to those having ordinary skill in the art that some electrical devices may incorporate the functionality of electrical interface thereby obviating the need for the electrical interface 804. The set of memory ICs 806 may include at least one memory device 100 (not indicated). Further, at least one of the ICs 806 may incorporate more than one type of memory array 100.

Figure 9:
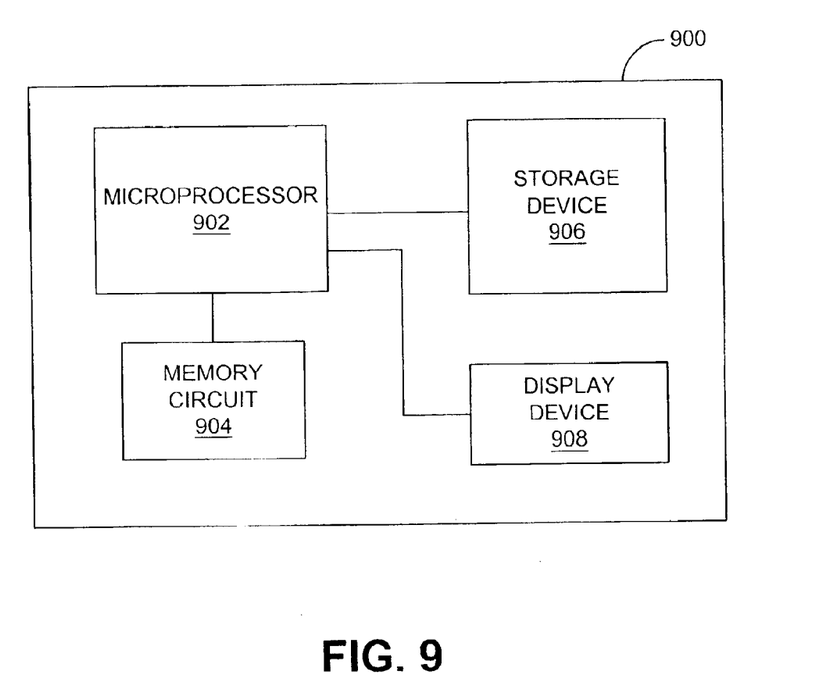
FIG. 9 is a block diagram of an electronic device that incorporates the memory device of FIG. 1.

FIG. 9 is a block diagram of an electronic device 900, such as a computer system, which incorporates a memory device 100. The electrical device 900 includes a microprocessor 902 that is coupled to a memory circuit 904 used to hold computer executable instructions and/or user data. Exemplary memory circuits 904 include basic input/output system (BIOS) memory, dynamic random access memory (DRAM), read only memory (ROM), and various levels of internal or external cache memory. The microprocessor 902 is also connected to a storage device 906 such as a hard disk drive, floppy drive, CD/DVD drive, tape drive and/or other mass storage devices such as those that incorporate semiconductor memory ICs 806 described above. The microprocessor 902 may include the 3D-memory architecture in its internal cache memory or in its memory ICs, such as in BIOS or other system memory areas such as DRAM and ROM circuits. The microprocessor 902 is further connected to a display device 908 that may also incorporate memory ICs 806.

Figure 10:
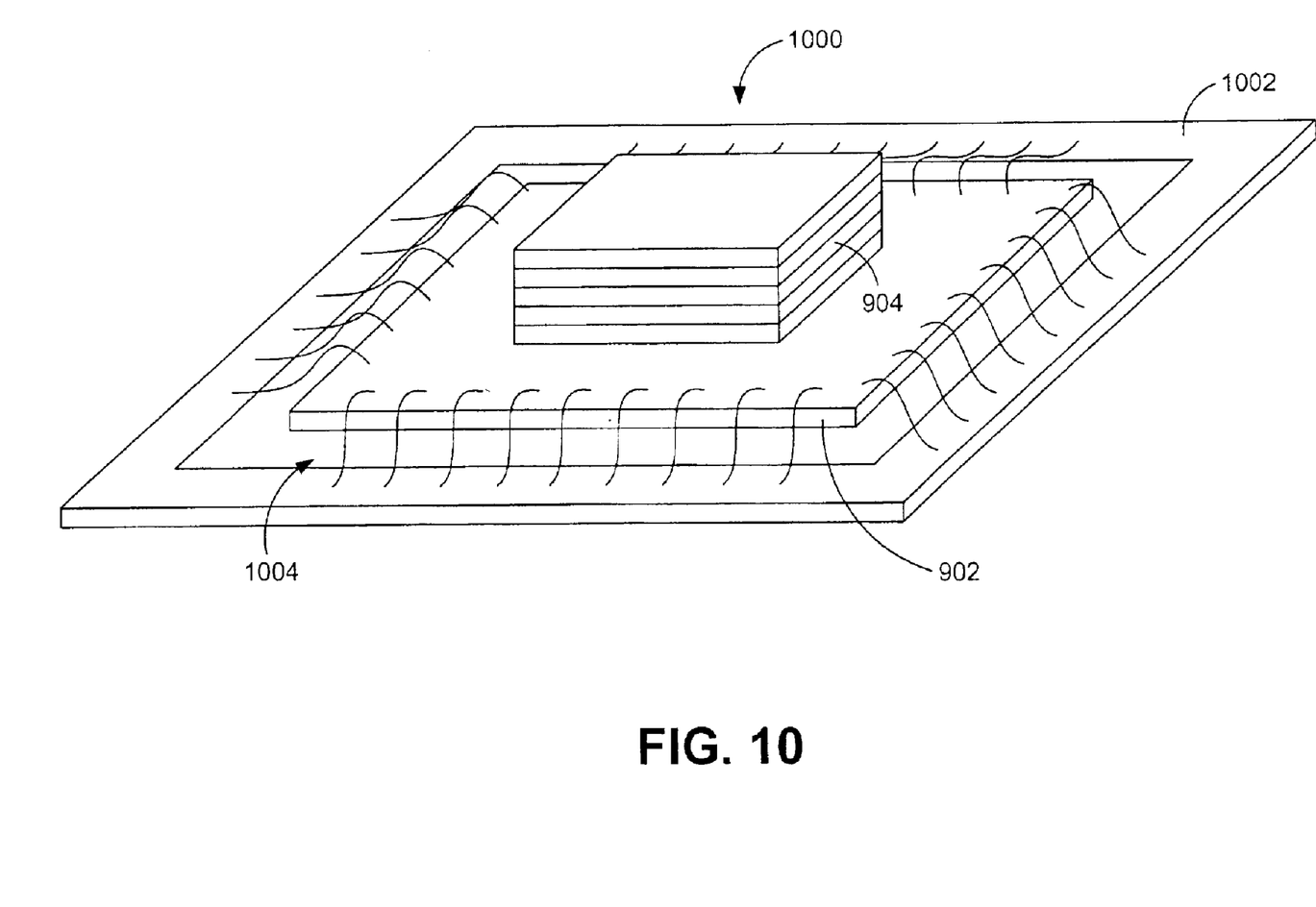
FIG. 10 is schematic perspective view of an embedded cubic memory array that incorporates the memory device of FIG. 1.

FIG. 10 is a schematic perspective view of an embodiment of an embedded cubic memory array 1000 that integrates the memory 904, such as level 1 and/or level 2 cache, with the microprocessor 902. The embedded cubic memory array 1000 is fabricated on top of a die of microprocessor 902 thereby allowing for a smaller die area size. Microprocessor 902 forms a horizontal substrate surface. Preferably, memory 904 is composed of at least one stacked layer of memory cells (not identified) that form the embedded cubic memory array 1000.

The memory cells may be interconnected by first and second sets of select lines (not shown) that are, for instance, formed within the embedded cubic memory array 1000 as vertical pillars. The sets of select lines are electrically connected to selection circuitry formed on the die of microprocessor 902. The microprocessor 902 is electrically attached to a package 1002 such as with bonding wires 1004 or with tape-automated bonding (TAB) circuit technology.

After the microprocessor 902 is attached to package 1002, it is encapsulated to provide protection from contaminants and handling. Although the embedded cubic memory array 1000 is shown as being disposed on a microprocessor IC, those having ordinary skill in the art will appreciate that any IC that utilizes memory circuits can be substituted for the microprocessor 902. One example would be a graphics display controller.

Although, in each of the above described embodiments, the memory cell 104 is shown having a planar-stacked orientation, persons having ordinary skill in the art will appreciate that other configurations are possible. For example, a tub well configuration, such as one of those disclosed in U.S. patent application Ser. No. 10/116,497, which has been incorporated by reference, may be used and the principals disclosed herein applied thereto. Specifically, intermediate conductors and/or storage elements within such configurations can be constructed and/or programmed in the manners described herein to reduce the amount of energy required to achieve a desired state-change.

What is claimed is:

1. A memory device, comprising:
    a cross-point array of memory cells, each memory cell comprising:
        a storage element; and
        a current concentrating feature that concentrates current applied to the storage element.

2. The memory device of claim 1, further comprising a control element and an intermediate conductor positioned between the control element and the storage element.

3. The memory device of claim 2, wherein the control element comprises a tunnel junction device.

4. The memory device of claim 2, wherein the control element comprises a diode.

5. The memory device of claim 2, wherein the storage element comprises an anti-fuse element.

6. The memory device of claim 2, wherein the storage element comprises a phase-change element.

7. The memory device of claim 6, wherein the current concentrating feature comprises a protrusion that extends from the intermediate conductor to the storage element.

8. The memory device of claim 7, wherein the protrusion comprises a sharp tip that concentrates current.

9. The memory device of claim 7, further comprising a layer of insulative material formed on the intermediate conductor such that only a tip of the protrusion contacts the storage element.

10. The memory device of claim 2, wherein the current concentrating feature comprises a conductive path that has been preprogrammed into a portion of the storage element.

11. The memory device of claim 10, wherein the conductive path is formed through a first layer of the storage element adjacent the intermediate conductor.

12. The memory device of claim 11, wherein the storage element further comprises a second layer formed of a state-changing material.

13. The memory device of claim 12, further comprising a barrier layer that separates the first layer and the second layer of the storage element.

14. The memory device of claim 12, wherein the first layer is formed of a state-changing material that changes state with lower applied currents than does the state-changing material of the second layer.

15. A process for writing to a memory cell of a memory device, comprising:
    applying current to a storage element of the memory cell using a protrusion of an intermediate conductor of the memory cell such that current is concentrated on a relatively small portion of the storage element so as to reduce the amount of energy necessary to change a resistance state of the storage element.

16. A process for facilitating writing to a memory cell of a memory device, comprising:
    preprogramming a storage element of the memory cell by forming a current path through a portion of the storage element that concentrates current applied to the storage element so as to reduce the amount of energy necessary to change a resistance state of the storage element.

17. A memory device, comprising:
    a cross-point array of memory cells, each memory cell comprising:
        a storage element having a preprogrammed filament fuse configured to be disabled during a write procedure.

18. The memory device of claim 17, further comprising a control element and an intermediate conductor positioned between the control element and the storage element.

19. The memory device of claim 18, wherein the control element comprises a tunnel junction device.

20. The memory device of claim 18 wherein the control element comprises a diode.

21. The memory device of claim 18, wherein the storage element comprises an anti-fuse element.

22. A process for writing to a memory cell of a memory device, comprising:
    applying a potential to the memory cell of sufficient magnitude to disable a preprogrammed filament fuse formed in a storage element of the memory cell.

23. A memory carrier, comprising:
    a carrier;
    a mechanical interface connected to the carrier;
    at least one memory integrated circuit, the memory integrated circuit comprising a cross-point array of memory cells, each memory cell comprising:
        a storage element; and
        a current concentrating feature that concentrates current applied to the storage element.

24. The memory carrier of claim 23, wherein the current concentrating feature comprises a protrusion that extends from the intermediate conductor to the storage element.

25. The memory carrier of claim 23, wherein the current concentrating feature comprises a conductive path that has been preprogrammed into a portion of the storage element.

26. A memory carrier, comprising:
    a carrier;
    a mechanical interface connected to the carrier;
    at least one memory integrated circuit, the integrated circuit comprising a cross-point array of memory cells, each memory cell comprising:
        a storage element a storage element having a preprogrammed filament fuse configured to be disabled during a write procedure.

27. The memory carrier of claim 26, wherein the storage element comprises an anti-fuse element.

28. An electronic device, comprising:
    a microprocessor;
    a storage device including a cross-point array of memory cells, each memory cell comprising:
        a storage element; and
        a current concentrating feature that concentrates current applied to the storage element.

29. The electronic device of claim 28, wherein the current concentrating feature comprises a protrusion that extends from the intermediate conductor to the storage element.

30. The electronic device of claim 28, wherein the current concentrating feature comprises a conductive path that has been preprogrammed into a portion of the storage element.

31. An electronic device, comprising:
- a microprocessor;
- a storage device including a cross-point array of memory cells, each memory cell comprising:
  - a storage element a storage element having a preprogrammed filament fuse configured to be disabled during a write procedure.

32. The electronic device of claim 31, wherein the storage element comprises an anti-fuse element.

33. An embedded cubic memory array, comprising:
- a package;
- a microprocessor; and
- memory including a cross-point array of memory cells, each memory cell comprising:
  - a storage element; and
  - a current concentrating feature that concentrates current applied to the storage element.

34. The embedded cubic memory array of claim 33, wherein the current concentrating feature comprises a protrusion that extends from the intermediate conductor to the storage element.

35. The embedded cubic memory array of claim 33, wherein the current concentrating feature comprises a conductive path that has been preprogrammed into a portion of the storage element.

36. An embedded cubic memory array, comprising:
- a package;
- a microprocessor; and
- memory including a cross-point array of memory cells, each memory cell comprising:
  - a storage element a storage element having a preprogrammed filament fuse configured to be disabled during a write procedure.

37. The embedded cubic memory array of claim 36, wherein the storage element comprises an anti-fuse element.

* * * * *